United States Patent
Doss

[11] 3,953,653
[45] Apr. 27, 1976

[54] METHOD TO TREAT A POLY(ARYLENE SULFIDE) SURFACE

[75] Inventor: Richard C. Doss, Bartlesville, Okla.

[73] Assignee: Phillips Petroleum Company, Bartlesville, Okla.

[22] Filed: Apr. 30, 1975

[21] Appl. No.: 573,183

[52] U.S. Cl. ............................ 428/419; 156/3; 156/309; 156/308; 427/322; 427/407
[51] Int. Cl.² ............................ B32B 27/06; C09J 5/02
[58] Field of Search ............ 156/83, 315, 307, 326, 156/308, 327, 309, 330, 310, 331, 2, 306, 3, 333; 428/419, 260, 543, 268, 457; 427/301, 322, 307, 407; 260/33.8 UA, 79.1

[56] References Cited
UNITED STATES PATENTS

| 2,078,910 | 4/1937 | Merrill | 156/308 |
|---|---|---|---|
| 2,637,751 | 5/1953 | Brooks | 156/338 |
| 3,235,426 | 2/1966 | Bruner | 156/307 |
| 3,455,775 | 7/1969 | Pohl et al. | 156/307 |
| 3,466,207 | 9/1969 | Vincent et al. | 156/3 |
| 3,607,473 | 9/1971 | Grunwald et al. | 156/2 |
| 3,616,186 | 10/1971 | Blackwell | 156/308 |
| 3,769,150 | 10/1973 | King et al. | 428/457 |
| 3,798,105 | 3/1974 | Hannah et al. | 156/309 |

Primary Examiner—William A. Powell
Assistant Examiner—J. J. Gallagher

[57] ABSTRACT

A poly(arylene sulfide) surface is pretreated by contacting this surface with an agent selected from the group consisting of specifically defined halogenated hydrocarbons which are either unsubstituted or substituted with a hydroxy group, organic acids and alkali metal hypohalogenites, with the additional provision that when the poly(arylene) sulfide surface consists of unfilled poly(arylene sulfide), the treating agent is selected from the halogenated hydrocarbons and the organic acids and when the poly(arylene sulfide) surface consists of fiberglass-filled poly(arylene sulfide), this surface is treated with an agent selected from the alkali metal hypohalogenites. The pretreated surface is adhesive-bonded to a solid surface resulting in a bond exhibiting a lap shear strength which is increased as compared to a bond involving the same materials without a pretreatment of the poly(arylene sulfide) surface.

20 Claims, 1 Drawing Figure

U.S. Patent  April 27, 1976  3,953,653
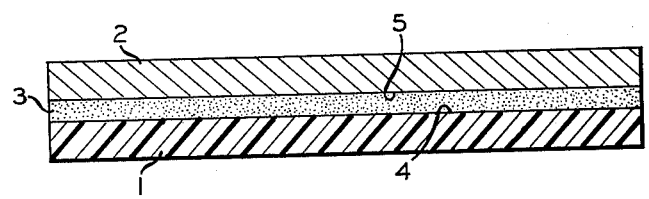

METHOD TO TREAT A POLY(ARYLENE SULFIDE) SURFACE

This invention relates to the treatment of a poly(arylene sulfide) surface. In accordance with one aspect of this invention, the treated poly(arylene sulfide) surface is adhesive-bonded to a solid surface. In another aspect, this invention relates to novel laminates. In still a further aspect, this invention relates to articles having a poly(arylene sulfide) surface with special properties.

BACKGROUND OF THE INVENTION

Plastic materials oftentimes have surfaces that create problems in further processing steps or during the use employing such plastic materials. Thus, for instance, the bonding of a plastic or other synthetic material to solid surfaces such as metal surfaces by applying adhesives between the synthetic material and the solid surface and bringing the two surfaces into contact with each other oftentimes does not result in a sufficiently strong band. For many plastic materials, pretreatments of various kinds have been proposed to increase the bonding strength of such adhesive bonds.

In other fields, the surfaces of many plastic materials have a luster and the surface is not water-wettable. For some applications it is desirable that the plastic surface does not have a luster or, in other words, that the plastic surface is rendered dull. For other purposes, e.g. in the process of plating plastic materials with, e.g.. metals, it is desirable that the plastic surface is water-wettable.

THE INVENTION

It is thus one object of this invention to provide a novel process for treating a poly(arylene sulfide) surface.

Another object of this invention is to provide a novel process for adhesive-bonding a poly(arylene sulfide) surface to a solid surface.

A further object of this invention is to provide an article having a water-wettable poly(arylene sulfide) surface.

Still another object of this invention is to provide a novel laminate in which at least one surface is a poly(arylene sulfide) surface.

These and other objects, advantages, aspects, embodiments and details of the invention will become apparent to those skilled in the art from the following description of the invention, the specific examples, the appended claims, and the drawing, which shows a schematic cross section through a laminate in accordance with this invention.

In accordance with one embodiment of this invention, a poly(arylene sulfide) surface is pretreated by contacting it with an agent selected from the group consisting of a. halogenated hydrocarbons and hydroxy-substituted halogenated hydrocarbons having the formula $$X_m-R'-Y$$

wherein R' is an $m+1$ valent saturated or olefinically unsaturated hydrocarbon radical having 1 to about 10 carbon atoms; each X is independently selected from the group consisting of hydrogen, fluorine, chlorine, bromine and iodine; Y is selected from the group consisting of hydroxy, hydrogen, fluorine, chlorine bromine and iodine; $m$ is an integer of up to 21, and wherein at least one halogen atom is present per molecule;

b. organic acids having the formula $$RCOOH$$

wherein R is selected from the group consisting of hydrogen and alkyl, cycloalkyl and aryl radicals being unsubstituted or substituted by one or more radicals selected from the group consisting of alkyl, cycloalkyl and aryl radicals, said radicals R having up to about 20 carbon atoms and c. hypohalogenites having the formula $$MOHal$$

wherein M is an alkali metal and Hal is a halogen atom, with the further provision that when the poly(arylene sulfide) surface consists of unfilled poly(arylene sulfide) the agent is selected from the group of agents defined above under (a) and (b) and when the poly(arylene sulfide) surface is a surface of fiberglass-filled poly(arylene sulfide), the agent is selected from the group of agents defined under (c) above. The pretreatment of the poly(arylene sulfide) surface in accordance with this invention results in a poly(arylene sulfide) surface that can be adhesively bonded to a solid surface, the bond exhibiting a lap shear strength that is higher than that of a bond of an unpretreated poly(arylene sulfide) surface to a solid surface. In addition, the pretreated poly(arylene sulfide) surface is water-wettable.

In accordance with one presently preferred embodiment of this invention, the agent (a) is selected from the group consisting of halogenated alkanes and hydroxy-substituted halogenated alkanes having the formula $$C_sX_{2s+1}Y,$$

and halogenated cycloalkanes, halogenated alkenes, hydroxy-substituted halogenated cycloalkenes and hydroxy-substituted halogenated alkenes, all four of these classes of compounds having the general formula $$C_nX_{2n-1}Y,$$

wherein in which formulae $s$ is an integer of 1 to about 10, $n$ is an integer of 2 to about 10 and X and Y have the same meaning as defined above.

Examples for the halogenated hydrocarbons (a) are halogenated alkanes such as iodomethane, methylene chloride, chloroform, fluorotrichloromethane, carbon tetrabromide, bromoethane, 1,2-difluoroethane, 1,1-dichloro-3,5-dibromohexane, and 1-iododecane; hydroxy-substituted halogenated hydrocarbons such as 2-bromoethanol and 1,5-dichloro heptan-3-ol; halogenated cycloalkanes such as iodocyclohexane and 1,3-dichlorocycloheptane; halogenated monoolefins such as tetrachloroethylene and 2-chloro-1-decene; hydroxy-substituted halogenated alkenes such as 2-bromo-2-propen-1-ol.

Examples for the organic acids (b) are formic acid, acetic acid, n-butyric acid, caproic acid, lauric acid, stearic acid, arachidic acid, cyclohexyl carboxylic acid, benzoic acid, p-toluic acid, 3-phenylcaprylic acid, and 2-cyclohexylbutyric acid.

It is presently preferred to use an agent selected from the group consisting of tetrachloroethylene, n-butyric acid, and bromoethane to treat an unfilled poly(arylene sulfide) surface.

Examples for the alkali metal hypohalogenites (c) used to treat the fiberglass-filled poly(arylene sulfide) surface are sodium hypochlorite and potassium hypochlorite. The sodium hypochlorite is presently the preferred agent.

In accordance with another embodiment of this invention, the hydroxy-substituted or unsubstituted halogenated hydrocarbon, as well as the organic acids, are applied as such to the unfilled poly(arylene sulfide) surface.

In accordance with still a further embodiment of this invention, a solution of a polymer in a treating agent selected from the group consisting of unsubstituted or hydroxy-substituted halogenated hydrocarbons and organic acids, all as defined above, is applied to the surface to be treated and the treating agent is thereafter removed from the treated surface, leaving at least a portion of the polymer dissolved in this treating agent on the treated surface.

In accordance with still another embodiment of this invention, the fiberglass-filled poly(arylene sulfide) surface is treated with an aqueous solution of the alkali metal hypohalogenites. The concentration of such solutions ranges preferably from about 2 to about 10 weight percent alkali metal hypohalogenite in water. However, higher or lower concentrations of this agent in water can be used.

The poly(arylene sulfide) used is a commercially available polymer known in the art. Such resins as well as methods to make same are described in U.S. Pat. No. 3,354,129, issued on Nov. 21, 1967, to J. T. Edmonds and Harold W. Hill, Jr. The poly(arylene sulfide) surfaces can be present on solid objects molded from said resin, on objects coated with said resin, on laminates of said resin with materials such as fiberglass, fabric, cloth, etc., as well as on any other suitable types of material possessing a cured or uncured poly(arylene sulfide) surface. The presently preferred polymer is poly(p-phenylene sulfide) resin, either unfilled or filled with chopped glass fibers. The presently preferred range of glass fiber filler is about 5 to about 60 weight percent fiberglass based on the filled poly(arylene sulfide).

In the present context, a cured poly(arylene sulfide) resin or coating is one which has been heat-treated for a time and at a temperature which is sufficient to increase the melt viscosity of the resin or the toughness of the coating. A typical cure procedure is 1 hour at 316° C (600° F).

The poly(arylene sulfide) surface is treated with the above defined and described treating agents in any convenient manner. The fashion in which the poly(arylene sulfide) surface is contacted with the treating agent will largely depend on the future use of the treated poly(arylene sulfide) surface and can e.g. be defined by the desired bond strength of an adhesive bond involving the treated surface, the size and shape of the surface of the article whose surface is to be treated and the temperature desired for treatment. The methods of treatment include spraying, wiping, pouring, sprinkling, immersion, and exposure to vapors. It is currently preferred to immerse the object or the surface thereof to be treated in a liquid treating agent.

The temperature of the treatment of the poly(arylene sulfide) can vary in wide ranges. The temperature depends upon the ultimate use of the surface, e.g. upon desired bond strength of a laminate including said poly(arylene sulfide) surface as well as on the melting and boiling points of the treating agents, the desired exposure time, and the softening, melting or decomposition points of the poly(arylene sulfide) surface. The temperature range for the treatment is from about 25° to about 275° C., temperatures in the range of about 50° to about 150° C. being preferred. Generally, the conditions of temperature and pressure are such that the treating agents contact the surfaces to be treated in substantially the liquid or solution phase.

The time of exposure of the poly(arylene sulfide) to the above-defined treating agent can be varied in very broad ranges. The exposure time depends upon the desired results, and thereby among other variables upon the treating agent and the temperature used. Generally, exposure times lie within a range of between fractions of a second and several hours, preferably in the range of about 3 seconds to about 2 hours.

A convenient way of determining the temperature and time for the treatment of the poly(arylene sulfide) surface is to treat the poly(arylene sulfide) surface with the treating agent until the luster of the surface dulls. Alternatively, these parameters for the surface treatment can be determined by treating the poly(arylene sulfide) surface for such a time and at such a temperature that the poly(arylene sulfide) surface becomes water-wettable. In this case, when the treated poly(arylene sulfide) surface is contacted with water, a thin film of water remains on the poly(arylene sulfide) surface without any "beading" or formation of water droplets with dry areas of poly(arylene sulfide) surface surrounding them.

After the treatment of the poly(arylene sulfide) surface with the treating agents defined above both for the unfilled poly(arylene sulfide) surface and fiberglass-filled poly(arylene sulfide) surface, any treating agent which has remained on the poly(arylene sulfide) surface is generally removed therefrom. This removal can conveniently be done by evaporation or by rinsing the poly(arylene sulfide) surface with water. It is also possible to dry the poly(arylene sulfide) surface thereafter before bonding.

In accordance with still a further embodiment of this invention, a first solid surface comprising poly(arylene sulfide) is adhesive-bonded to a second solid surface by pretreating the first solid surface comprising the poly(arylene sulfide) by contacting this first solid surface with an agent as defined above and adhesive-bonding the pretreated first solid surface comprising the poly(arylene sulfide) and the second solid surface.

In effecting the desired bonding of this invention, the treating agent is removed from the first surface of poly(arylene sulfide), the first and the second surfaces are brought in contact with a layer of adhesive between them and these surfaces are kept in their position until said adhesive has sufficiently solidified. The removal of the treating agent from the poly(arylene-sulfide) surface is conveniently done by evaporating the organic treating agents from the unfilled poly(arylene sulfide) surface or by rinsing the fiberglass-filled poly(arylene sulfide) surface after the treatment with the alkali metal hypohalogenite, e.g. with water.

Another embodiment of this invention comprises applying a solution of a polymer in one of the treating agents to at least the poly(arylene sulfide) surface (first surface), removing the treating agent from this first surface while leaving the polymer on the first surface and then adhesive-bonding the first and a second surface. In this embodiment it is particularly preferred that the polymer dissolved in the treating agent and a polymer constituting an ingredient of the adhesive are the same. Thus a poly(arylene sulfide) surface is, e.g., treated with a solution of polysulfone in methylene chloride, the methylene chloride is evaporated and the pretreated poly(arylene sulfide) surface is then bonded to the second surface by using an adhesive on polysulfone basis.

The second surface to which the poly(arylene sulfide) surface is to be bonded in accordance with one embodiment of this invention can be any solid surface. Examples for materials from which said second surfaces can be made are metals such as steel, aluminum and copper, plastics such as polyethylene, polypropylene, poly(vinyl chloride), acrylonitrile-butadiene-styrene resin, polystyrene; wood, ceramic, glass and concrete.

In accordance with a further embodiment of this invention, which is applicable both to the adhesive-bonding of a fiberglass-filled poly(arylene sulfide) surface and an unfilled poly(arylene sulfide) surface to a second surface, the second surface is pretreated, too, in order to increase the binding strength between the adhesive and the second surface. Examples of such treatment are mechanical roughening, heat treatment, solvent treatment and the use of a primer.

What specific adhesive is employed depends to a certain degree upon the nature of the second surface used and the intended use of the bonded article. As a general rule, the adhesive used will not detrimentally affect the poly(arylene sulfide) surface or the second surface. Examples of useful adhesives which are commercially available are adhesives based upon epoxy resins, cyanoacrylate resins, polysulfones, rubber, polyamides, and polysilicones. The adhesives presently preferred are adhesives based on epoxy resins, polysulfone resins and cyanoacrylate resins.

The adhesives can be applied to the poly(arylene sulfide) surface, the second surface or to both surfaces. The adhesives, depending upon their nature, can be applied in any commonly used convenient way. Thus they can be applied, for example, as a solution, an emulsion or as a hot melt. The thickness of the adhesive film can be varied in broad ranges. The thickness of the adhesive film is usually determined by the desired bond strength.

The treated poly(arylene sulfide) surface (first surface) and the second solid surface in this embodiment of the invention are bonded together in a conventional manner. The appropriate adhesive is applied between the two surfaces and these are then sandwiched together. The contact time, temperature and pressure applied depend upon the adhesive used. These conditions are selected such that the adhesive cures, hardens, or polymerizes, etc., to a degree resulting in the bonding strength desired. The temperature, which is largely dependent on the type of adhesive used, will be selected such that it is below the melting point, decomposition temperature, ignition temperature or deformation temperature of the poly(arylene sulfide) surface and the second solid surface. These temperatures for the bonding preferably lie in the range of about 0° to about 375° C.

Pressures of 2 up to about 10,000 psig can be employed. It is generally, however, more convenient to use pressures near atmospheric pressure.

The time employed while keeping the two surfaces together in the desired position has to be long enough to effect a sufficient bonding between the two surfaces. This time again depends upon the type of adhesive used and the temperature employed. The times will generally be in the range of 1 minute to 48 hours, preferably in the range of about 5 minutes to about 24 hours.

In accordance with still a further embodiment of this invention, there is provided a new article of manufacture having a poly(arylene sulfide) surface having been treated as defined above. This poly(arylene sulfide) surface preferably is water-wettable, which property has been defined earlier. This new article advantageously can be adhesive-bonded to other solid objects, the bond thus produced exhibiting a considerable bond strength.

In accordance with another embodiment of this invention, there is a provided a laminate which comprises at least three layers, the first layer having a poly(arylene sulfide) surface pretreated as defined above, a second layer having a solid surface facing the pretreated poly(arylene sulfide) surface, and the third layer consisting essentially of adhesive material in contact both with the pretreated first surface of poly(arylene sulfide) and the second solid surface. This sandwich structure exhibits a considerably higher lap shear strength than one made from exactly the same materials, however, without having a specially pretreated poly(arylene sulfide) surface.

In the drawing, a schematic cross section of such a laminate is shown.

This laminate structure comprises a first layer 1, a second layer 2, and a third layer 3. The first layer 1 has a surface 4 which has been pretreated as defined above and as explained in more detail in the following examples. This pretreated surface 4 is in contact with the third layer 3 of an adhesive. The other surface of the third layer 3 of adhesive is in contact with the solid surface 5 of the second layer 2. The layer 1 can consist entirely of unfilled poly(arylene sulfide) or fiberglass-filled poly(arylene sulfide). Layer 1 can, however, also be made from a different material, which has been coated with one of the poly(arylene sulfide) materials just mentioned.

The invention will be more fully understood from the following examples which illustrate preferred embodiments of this invention. These examples are not intended to limit the scope of protection.

EXAMPLE I

Seven samples having a surface of unfilled poly(p-phenylene sulfide) were prepared as follows. A dispersion of 40 weight percent of poly(p-phenylene sulfide) powder in propylene glycol was prepared by thoroughly mixing the two components. The poly(p-phenylene sulfide) had a melt flow of 6,000 to 7,000 measured in accordance with ASTM D-1238-70, employing the modification of use of 316° C. and a weight of 5 kilograms. This dispersion was applied to rectangular aluminum coupons of 1 × 4 inches size and 0.065 inch thickness. The aluminum coupons had been previously cleaned in chromic acid solution, rinsed with water and dried. The coated aluminum coupons were heated to 316° C. in air for about 15 minutes in order to remove propylene glycol therefrom. The aluminum coupons then had a coating of poly(p-phenylene sulfide) in a thickness of 0.001 to 0.002 inch. These samples are referred to in the following table as PPS Type V.

Seven samples having a surface of fiber-glass filled poly(p-phenylene sulfide) were prepared as follows. The same poly(p-phenylene sulfide) powder described above was heated to a temperature of about 260° C. in air for a sufficient time to reduce the melt flow from the value of 6,000 to 7,000 to a value of about 50. The polymer was then melted and intimately mixed with a quantity of chopped glass fibers to result in a mixture containing 40 weight percent of glass fibers in the total compositon. The glass-filled composition was molded into slabs. These were cut into coupons measuring 1 × 4 inches and having a thickness of 0.125 inch. These samples are referred to as PPS Type R in the following table.

These 14 samples were treated by immersing them into the different treating agents shown in the following table for periods of time and at temperatures also shown in the following table.

After this treatment the poly(arylene sulfide) surfaces were rinsed with distilled water and dried in air. Samples having aluminum surfaces to be bonded to the poly(arylene sulfide) surfaces were prepared as follows. Rectangular aluminum coupons measuring 1 × 4 inches and having a thickness of 0.065 inch were cleaned by immersing them into a solution of 30 gm sodium dichromate, 300 gm concentrated sulfuric acid and 90 gm water for 10 minutes at a temperature of 65°–70° C. These cleaned coupons were then rinsed with water and dried in air.

Thereafter, an adhesive was prepared by thoroughly mixing 9.5 grams epoxy composition (commercially available as Epon 828, from Shell Chemical Co.), 6.5 grams pentaerythritol tetra-3-mercaptopropionate (commercially available as Q-43 from Evans Chemetics) and 0.1 gram tris(dimethylaminomethyl)phenol (commercially available as DMP-30, by Rohm and Haas). About 1 square inch of the aluminum coupon was coated with a layer of about 0.005 to about 0.01 inch thickness of the adhesive thus prepared. The poly(arylene sulfide) samples were arranged on the adhesive-coated area of the aluminum surface so that the poly(arylene sulfide) sample and the aluminum sample overlapped in an area of 0.5 × 1 inch. In this area of ½ square inch, a sandwich structure aluminum-adhesive-poly(arylene sulfide) existed. The sandwiched samples were cured at 25° C. for 3 hours and then at 100° C. for 8 hours. Thereafter, the lap shear strength of all the samples was measured and the results are shown in the following Table I.

TABLE I

| Sample No. | Surface Treatment[a] Agent | Time, min. | Temp., °C. | PPS[b] Type | LSS[c] |
|---|---|---|---|---|---|
| 1 (Comp.) | None | — | — | V | 660 |
| 2 (Comp.) | Chromic acid[e] | 15 | 70 | V | 230 |
| 3 (Comp.) | Nitric acid[f] | 5 | 70 | V | 540 |
| 4 (Comp.) | NaOCl[d] | 30 | 80 | V | 580 |
| 5 (Inv.) | Tetrachloroethylene | 30 | 100 | V | 1590 |
| 6 (Inv.) | n-Butyric acid | 30 | 100 | V | 1560 |
| 7 (Inv.) | Bromoethane | 30 | 40 | V | 1440 |
| 8 (Comp.) | None | — | — | R | 330 |
| 9 (Comp.) | Chromic acid[e] | 15 | 70 | R | 370 |
| 10 (Comp.) | Nitric acid[f] | 5 | 70 | R | 420 |
| 11 (Comp.) | Tetrachloroethylene | 30 | 100 | R | 410 |
| 12 (Comp.) | n-Butyric acid | 30 | 100 | R | 400 |
| 13 (Comp.) | Bromoethane | 30 | 40 | R | 300 |
| 14 (Inv.) | NaOCl[d] | 30 | 80 | R | 580 |

[a]Poly(p-phenylene sulfide) surface immersed in liquid agent for time and temperature specified.
[b]Poly(p-phenylene sulfide).
[c]Lap shear strength, psi. Measured at 25°C. according to ASTM D 1002-53T using Instron Model TT instrument at cross head speed of 0.05 in./min.
[d]Clorox — commercially available solution of 5.25 weight percent NaOCl in water.
[e]Solution of 30 gm sodium dichromate, 300 gm concentrated sulfuric acid and 90 gm deionized water was used.
[f]HNO₃ (concentrated).

The data in Table I show that the treatment of the unfilled poly(arylene sulfide) surface with tetrachloroethylene, n-butyric acid or bromoethane drastically increases the lap shear strength as compared to the untreated surface. A treatement of the surface with chromic acid, nitric acid or sodium hypochlorite decreased the lap shear strength. On the other hand, in the case of the fiberglass-filled poly(arylene sulfide), the above shown results demonstrate that tetrachloroethylene, n-butyric acid and bromoethane are similarly ineffective as chromic acid and nitric acid for a pretreatment to increase the lap shear strength. However, a pretreatment of the fiberglass-filled poly(arylene sulfide) with sodium hypochlorite resulted in a considerable increase of a lap shearstrength.

EXAMPLE II

Two samples having an unfilled poly(phenylene sulfide) surface were prepared as described in Example I (type V samples). One sample thereof was treated with a 10 weight percent solution of polysulfone having a molecular weight range of 22000–36000 (commercially available as polysulfone P-1700 from Union Carbide Corporation) in methylene chloride ($CH_2Cl_2$ at room temperature by applying this solution to the surface of this sample as a thin film. Then the sample was dried at 260°C for 10 min. A 0.065 inch thick aluminum coupon (1 × 4 inches) was cleaned with a chromic acid solution, rinsed and dried. To this aluminum coupon the pretreated sample was bonded by overlapping the treated PPS surface and the aluminum surface in an area of 0.5 in.², applying 2000 psig to the sandwich and keeping it under this pressure and at 370° C for 10 min. The second sample having an untreated poly(phenylene sulfide) surface was bonded to a second aluminum coupon using the same adhesive. For both bonds the lap shear strength was measured as described above in connection with example I. The results are shown in the following Table II.

TABLE II

| Sample No. | Surface Treatment | LSS |
|---|---|---|
| 15 (Inv.) | Polysulfone/CH$_2$Cl$_2$ | 880 |
| 16 (Comp.) | None | 560 |

These results show again the improvement achieved by the pretreatment of the poly(phenylene sulfide) in accordance with the present invention.

Reasonable variations and modifications which will be apparent to those skilled in the art can be made in this invention without departing from the spirit and scope thereof.

We claim:

1. A method of treating a poly(arylene sulfide) surface which comprises contacting said poly(arylene sulfide) surface with an agent selected from the group consisting of
   a. halogenated hydrocarbons and hydroxy-substituted halogenated hydrocarbons having the formula $$X_m—R'—Y$$

wherein R' is an $m+1$ valent saturated or olefinically unsaturated hydrocarbon radical having 1 to about 10 carbon atoms, each X is independently selected from the group consisting of hydrogen, fluorine, chlorine, bromine and iodine, Y is selected chlorine, bromine and iodine, $m$ is an integer, and wherein at least one halogen is present per molecule;
   b. organic acids having 1 to about 20 carbon atoms per molecule and having the formula

RCOOH wherein R is selected from the group consisting of hydrogen and alkyl, cycloalkyl and aryl radicals being unsubstituted or substituted by one or more radicals selected from the group consisting of alkyl, cycloalkyl and aryl radicals and
   c. hypohalogenites having the formula MOHal wherein M is an alkali metal and Hal is a halogen atom
   with the further provision that when the poly(arylene sulfide) surface consists of unfilled poly(arylene sulfide) the agent is selected from the group of agents defined under (a) and (b) above and when the poly(arylene sulfide) surface is a surface of fiberglass-filled poly(arylene sulfide), the agent is selected from the group of agents defined under (c) above.

2. A method in accordance with claim 1 wherein a solid surface of unfilled poly(arylene) sulfide is contacted with an agent selected from the group consisting of halogenated alkanes and hydroxy-substituted halogenated alkanes having the formula $$C_sX_{2s+1}Y$$

and halogenated cycloalkanes, halogenated alkenes, hydroxy-substituted halogenated cycloalkanes and hydroxy-substituted halogenated alkenes having the formula $$C_nX_{2n-1}Y$$

wherein $s$ is an integer of 1 to about 10 and $n$ is an integer of 2 to about 10.

3. A method in accordance with claim 2 wherein said agent is selected from the group consisting of tetrachloroethylene, n-butyric acid and bromoethane.

4. A method in accordance with claim 1 wherein said poly(arylene sulfide) is poly(p-phenylene sulfide).

5. A method in accordance with claim 1 wherein an unfilled poly(arylene sulfide) surface is treated with said agent having a polymer dissolved therein.

6. A method in accordance with claim 5 wherein the unfilled poly(arylene sulfide) surface is contacted with a polysulfone solution in methylene chloride.

7. A method of bonding a first solid surface comprising poly(arylene sulfide) to a second solid surface comprising
   1. contacting said first solid surface with an agent selected from the group consisting of
      a. halogenated hydrocarbons and hydroxy-substituted halogenated hydrocarbons having the formula $$X_m—R'—Y$$

wherein R' is an $m+1$ valent saturated or olefinically unsaturated hydrocarbon radical having 1 to about 10 carbon atoms, each X is independently selected from the group consisting of hydrogen, fluorine, chlorine, bromine, and iodine, Y is selected from the group consisting of hydroxy, hydrogen, fluorine, chlorine, bromine and iodine, $m$ is an integer and wherein at least one halogen is present per molecule,
      b. organic acids having 1 to about 20 carbon atoms per molecule and having the formula

RCOOH wherein R is selected from the group consisting of hydrogen and alkyl, cycloalkyl and aryl radicals being unsubstituted or substituted by one or more radicals selected from the group consisting of alkyl, cycloalkyl and aryl radicals,
      c. hypohalogenites having the formula MOHal wherein M is alkali metal and Hal is a halogen atom
      with the further provision that when the poly(arylene sulfide) surface consists of unfilled poly(arylene sulfide), the agent is selected from the group of agents defined above under (a) and (b) and when the poly(arylene sulfide) surface is a fiberglass-filled poly(arylene sulfide) surface, the agent is selected from the group of agents defined above under (c), and thereafter
   2. adhesive-bonding said first solid surface and said second solid surface.

8. A method in accordance with claim 7 wherein said first solid surface consists of unfilled poly(arylene sulfide) and said first solid surface is treated with an agent selected from the group consisting of halogenated alkanes and hydroxy-substituted halogenated alkanes having the formula $$C_sX_{2s+1}Y$$

and halogenated cycloalkanes, halogenated alkenes, halogenated hydroxy-substituted cycloalkanes and halogenated hydroxy-substituted alkenes having the formula $$C_nX_{2n-1}Y$$

wherein s is an integer of 1 to about 10 and n is an integer of 2 to about 10.

9. A method in accordance with claim 8 wherein said agent is selected from the group consisting of tetrachloroethylene, n-butyric acid and bromoethane.

10. A method in accordance with claim 7 wherein said poly(arylene sulfide) is poly(p-phenylene sulfide).

11. A method in accordance with claim 7 wherein said adhesive composition is selected from the group consisting of epoxy-based adhesives, cyanoacrylate-based adhesives, polysulfone-based adhesives, rubber-based adhesives, polymide-based adhesives and silicone-based adhesives.

12. A method in accordance with claim 7 wherein said adhesive composition is selected from the group consisting of epoxy-based adhesives, polysulfone-based adhesives and cyanoacrylate-based adhesives.

13. A method in accordance with claim 7 wherein said second surface is roughened before it is bonded to the treated first surface.

14. A method in accordance with claim 7 wherein
  a. said first solid surface of unfilled poly(arylene sulfide) is treated with said agent having a polymer dissolved therein,
  b. said agent is removed from said first surface leaving polymer on said first surface
  c. said first and said second solid surface are adhesive bonded together.

15. A method in accordance with claim 14 wherein
  a. said first solid surface is treated with a polysulfone solution in methylene chloride,
  b. said methylene chloride is removed from said first surface leaving polysulfone on said first surface
  c. said first and said second solid surfaces are bonded together using polysulfone adhesive.

16. Method in accordance with claim 7 wherein said first solid surface consists essentially of fiberglass-filled poly(arylene sulfide) comprising:
  a. contacting said first solid surface with a treating agent containing an alkali metal hypohalogenite having the general formula MOHal wherein M is an alkali metal and Hal is a halogen atom;
  b. removing said treating agent from said first solid surface; and
  c. bonding the first solid surface to the second solid surface with an adhesive composition.

17. A method in accordance with claim 16 wherein said treating agent contains sodium hypochlorite.

18. A method in accordance with claim 7 wherein said second solid surface consists essentially of a material selected from the group consisting of steel, aluminum, copper, polyethylene, polypropylene, poly(vinyl chloride), acrylonitrile-butadiene-styrene resins, polystyrene, wood, ceramic, glass and concrete.

19. The product of the process of claim 1.
20. The product of the process of claim 7.

* * * * *